United States Patent [19]

Tanaka et al.

[11] Patent Number: 5,543,890
[45] Date of Patent: Aug. 6, 1996

[54] PROCESS AND DEVICE FOR ADJUSTING THE DISTANCE BETWEEN A WORKPIECE AND A MASK

[75] Inventors: Yoneta Tanaka, Kanagawa; Shoichi Okada, Kawasaki, both of Japan

[73] Assignee: Ushiodenki Kabushiki Kaisha, Japan

[21] Appl. No.: 271,950

[22] Filed: Jul. 8, 1994

[30] Foreign Application Priority Data

Jul. 8, 1993 [JP] Japan ................................ 5-192709

[51] Int. Cl.⁶ .......................... G03B 27/42; G03B 27/44; G03B 27/04
[52] U.S. Cl. ............................. 355/53; 355/54; 355/86; 355/95
[58] Field of Search ............................... 355/53, 54, 86, 355/95; 437/924, 931, 948, 984

[56] References Cited

U.S. PATENT DOCUMENTS

| | | | |
|---|---|---|---|
| 3,192,844 | 7/1965 | Szasz et al. | 355/53 |
| 4,431,304 | 2/1984 | Mayer | 355/54 |
| 4,583,847 | 4/1986 | Battig et al. | 355/53 |

Primary Examiner—Arthur T. Grimley
Assistant Examiner—Herbert Kerner
Attorney, Agent, or Firm—Sixbey, Friedman, Leedom & Ferguson, P.C.; David S. Safran

[57] ABSTRACT

A process and device for adjusting distance for purposes of parallel positioning of a workpiece relative to a mask at a preset distance in which production can be done easily and with low costs. A workpiece is held at a distance from a mask on a work-holding fixture and one of the work-holding fixture and a mask carrier carrying the mask is moved by a moving device toward the other to bring the workpiece comes into contact with the mask. After such contact has occurred, movement of the moving device is continued until a signal is transmitted to a system controller from each of at least three alignment devices which are arranged on the work-holding fixture or the mask carrier, the alignment devices having calibration device which essentially begin to move beginning at a time at which the workpiece and mask come into contact with one another and can no longer execute any further relative movement. Movement of the work-holding fixture or the mask carrier is stopped when the system controller receives a signal from all of the calibration devices, which thus is assessed as achievement of a parallel alignment of the workpiece and mask relative to one another, at which time the displacement of the calibration device of each alignment device is fixed. Thereafter, the direction of movement of the one of the work-holding fixture and the mask carrier is reversed until the desired spacing distance is achieved.

3 Claims, 8 Drawing Sheets

PROCESS AND DEVICE FOR ADJUSTING THE DISTANCE BETWEEN A WORKPIECE AND A MASK

BACKGROUND OF THE INVENTION

1. Field of the Invention

The invention relates to a process and a device for adjusting the distance between a workpiece and a mask in an exposure device which is used in the process of manufacturing a semiconductor device.

2. Description of Related Art

Conventionally, so-called proximity exposure is done in which a workpiece and a mask are arranged at microscopically small distance to one another. In doing so, a semiconductor wafer or a glass substrate for a liquid crystal display is used for a workpiece. In the following, a workpiece is representatively called a wafer.

FIG. 12 schematically shows a proximity exposure device. Emitted light from light source 1 is incident by means of oval reflector 2 on integrator lens 3. Output light from integrator lens 3, after one passage through collimation lens 4, passes through mask M, on which a circuit pattern and the like are drawn, and irradiates wafer W. A distance between mask M and wafer W is roughly 20 microns, with a tolerance of no more than 2 microns.

The aforementioned "microscopic distance" was usually attained in such a way that a carrier with a spherical seat system is moved up and down relative to the mask M. FIG. 11 shows a device using such a spherical seat system.

Carrier 5 on which a wafer W is placed is located on spherical seat Carrier 5 is provided with vacuum line 8 for drawing the wafer onto carrier 5 by suction. Spherical seat 6 is provided with a vacuum line 9 for holding carrier 5 on the spherical seat 6. Vacuum lines 8 and 9 are connected to a vacuum suction holder which is not shown in the drawing. Spherical seat 6 can be moved up and down by means a moving device 7. In a device of this type, the processes described below are executed:

First, carrier 5 is lowered sufficiently by means of the moving device 7. In this state wafer W is seated on carrier 5. Then, wafer W is drawn against carrier 5 by operation of the vacuum suction holder and vacuum line 8. While the wafer W is held against the carrier 5, it is raised in the direction toward mask M by the moving device 7. In this case, the vacuum line 9 is not yet activated and spherical seat 6 and carrier 5 are arranged in a free positional relationship to one another.

After raising wafer W until it comes into contact with mask M, moving device 7, and thus upwards motion of wafer W, are stopped. Carrier 5 is tilted in this case by means of spherical seat 6, so that it is located parallel to mask M. In this way, a parallel positional relationship between wafer W and mask M is achieved.

Next, carrier 5 is drawn by suction onto spherical seat 6 by activating vacuum line 9. Then, carrier 5 is lowered by only a set distance. This distance is the above-mentioned "microscopic distance".

Distance adjustment of this type between the wafer and a mask must be done each time when a wafer is exposed. This is because when wafer W is drawn onto carrier 5 by suction, as the result of the nonuniformity of the suction, wafer W is tilted, or that as the result of the nonuniform thickness of the respective wafer W a deviation of the parallel positional relationship occurs between wafer W and mask M.

In the process described above for adjusting the distance between a mask and a wafer using a spherical seat system, it is considered a disadvantage that high surface precision of the spherical surface is required and that, therefore, producing the carrier and the spherical seat is both time- and cost-intensive.

SUMMARY OF THE INVENTION

Therefore, the primary object of the present invention is to provide a process for adjusting distance for purposes of parallel positioning of a workpiece relative to a mask at defined distance in which production can be done easily and with low costs, and to devise a device for executing the process.

The above object is achieved relative to the process by the following process steps:

a) Holding a workpiece on a work-holding fixture in a state in which the workpiece does not come into contact with a mask;

b) Moving the work-holding fixture and/or a mask carrier provided with a mask by means of a moving device to bring the workpiece into contact with the mask;

c) Continuing the operation of the moving device even after the workpiece comes into contact with the mask;

d) Transmitting a signal to a system controller from each of at least three means for alignment (hereafter referred to as "calibration devices") which are arranged in the work-holding fixture or the mask carrier and which essentially begin to move and accept a propulsive force from the moving device as soon as the workpiece and mask come into,contact with one another, and which essentially cannot execute any further motion once a specified displacement has occurred;

e) Stopping movement of the work-holding fixture and/or the mask carrier when a time is reached at which the system controller has received from each calibration device the signal described above and which thus is assessed as achievement of a parallel alignment of the workpiece and mask relative to one another, and keeping constant a displacement state, at this time, in the respective calibration device; and f) Moving the work-holding fixture and/or the mask carrier by a specified distance in a direction opposite the motion described above in order to form the desired spacing.

The device according to the invention for adjusting the distance between a mask and a wafer has a work-holding fixture for holding a workpiece, a mask carrier for holding a mask, a moving device for moving the work-holding fixture and/or the mask carrier described above, such that the workpiece and the mask are brought close to one another or are moved apart from one another, and at least three calibration devices which are arranged such that the work-holding fixture or the mask carrier is connected to the moving device described above.

The object of the invention is, furthermore, achieved by the fact that the calibration devices described above begin to shift and to accept a propulsive force from the moving device described above, beginning at a time at which, in the case that the moving device described above is driven in a direction in which the workpiece and the mask come into contact with one another, and that the moving device described above is further moved after contact of the workpiece with the mask in the direction described above, the workpiece and the mask touch one another, and the relative motion described above is essentially no longer possible, and that the calibration devices described above have a determination device for determining a displacement of the calibration device described above to a certain degree and a retaining device for holding the displacement state at this time.

Moreover, advantageously, the calibration devices described above have a housing, a shaft located in the housing, a guide component for controlling motion of this component only up or down, a first elastic component which is installed within the housing and which exerts force on the shaft, a blade-type electrical body, a retaining device for holding one state of the shaft in a certain position over the elastic body described above, a determination device for determining the amount of displacement of the first elastic component described above, a sphere located between a shaft tip and the work-holding fixture or the mask carrier, and a second elastic component for mutually drawing together the shaft and the mask carrier with a certain force.

The process according to the invention and the device according to the invention for adjusting the distance between a workpiece and a mask enable production which is simpler compared to the spherical seat system and which causes lower costs since no spherical arrangement is used in which high surface precision is required, as when using the spherical seat system. These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENT

Figure 1:
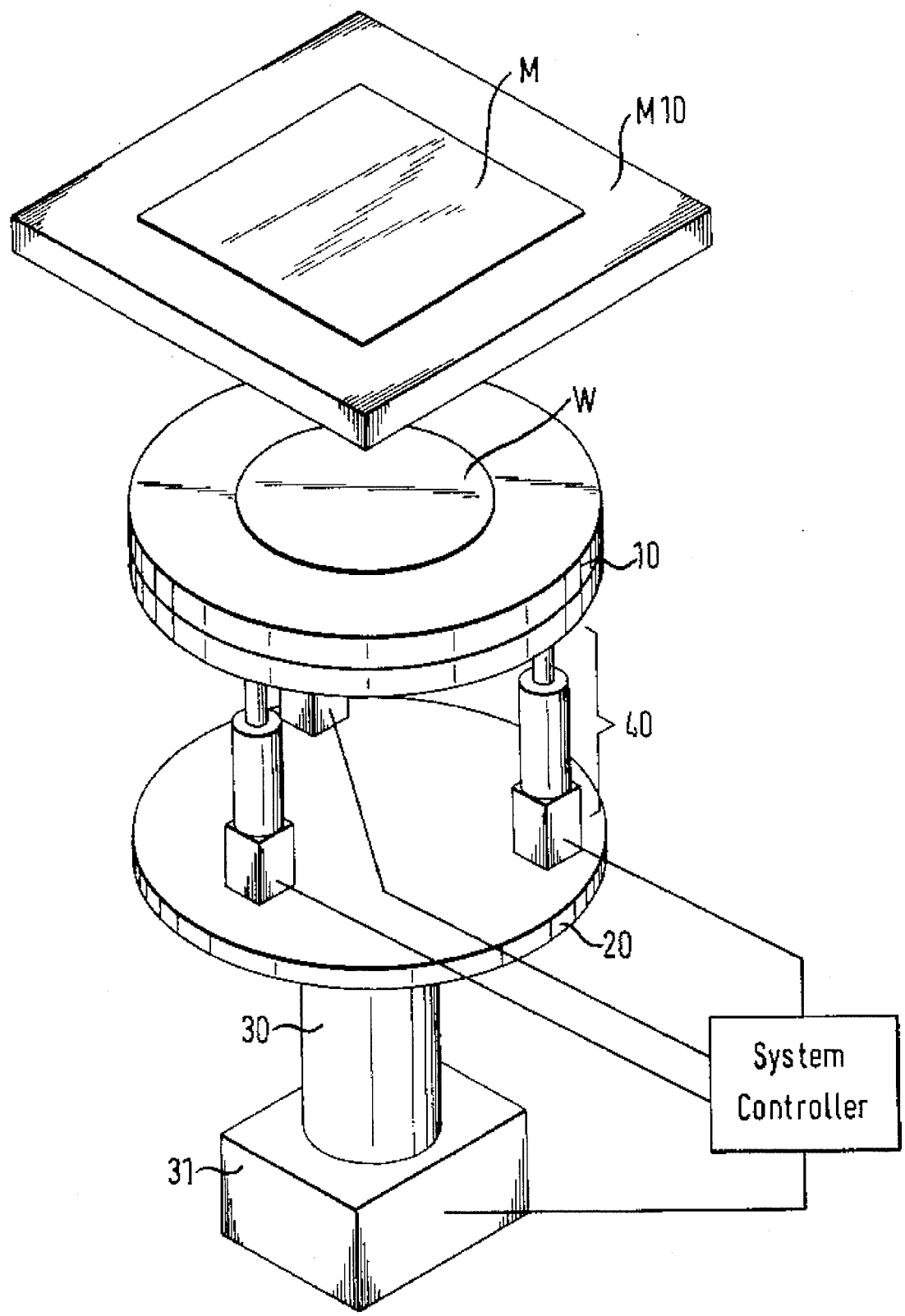
FIG. 1 shows a schematic representation of important parts of the device according to the invention for adjusting the distance.

FIG. 1 shows in schematic form a device for performing the process according to the invention for adjusting the distance between a workpiece and a mask. In this representation, reference number 10 designates a work-holding fixture which is called a carrier, below. A base 20 is, mounted on a column 30 and is connected to carrier 10 on which wafer W is seated by calibration devices 40. Carrier 10 is formed, for example, of aluminum and is connected by contact with a V-shaped bearing 11 which, along with a steel sphere 12, connect the carrier 10 with calibration device 40. Therefore, carrier 10 can be easily replaced with one appropriate to the size of the particular wafer W.

Column 30 is connected to a moving device 31 which is only diagrammatically depicted and which, for example, is an air cylinder, a rotary cam or the like. The moving device need only be capable of a single movement of column 30 up and down and is not further described here since such a moving device 31 is of conventional design.

The moving device is furthermore connected to a system controller described below, by which motion control information is transmitted.

Base 20 is located on the top of column 30 and has roughly the same shape as carrier 10. Rod-shaped calibration devices 40 are arranged vertically on base 20. Because carrier 10 is placed on one top of calibration devices 40, as is described above, it is necessary for positioning of carrier 10 that there are at least three calibration devices.

Mask M is held by means of mask carrier M 10 by an arrangement not shown in the drawing, for example, by a vacuum suction system at a side of mask carrier M 10 facing away from wafer W. Therefore, the mask can be easily replaced with another mask by terminating suction.

In the following, the process for adjusting the distance between the wafer and the mask is described:

First, to expose a circuit pattern drawn on the mask M, wafer W is placed on carrier 10 by means of a carrier arm or the like and is held on the carrier 10 by means of vacuum suction or the like. A distance between mask M and wafer W is then roughly 3 to 4 mm.

When wafer W is placed in carrier 10, column 30 moves upward according to a signal from the system controller, that is, in the direction toward mask M. Accordingly, base 20 connected to column 30, carrier 10 and wafer W, likewise, move in the direction toward mask M.

This movement described above is continued without stopping the drive of the moving device 31, even after the wafer W has come into contact with the mask M.

Within calibration devices 40, a flat coil compression spring 44 is installed as a first elastic component, described below, which accepts a propulsive force from the moving device 31 and begins to be displaced beginning at a time at which wafer W comes into contact with mask M and essentially no further motion is possible.

As also described below, achieving of a set amount of displacement of the flat coil compression spring 44 is communicated by means of a determination device 48 to the system controller. Calibration devices 40 are, as described above, located at least at three sites, and a signal is sent from each calibration device to the system controller. If the system controller has received the signal described above from all calibration devices 40, the upwardly directed motion of column 30 is stopped. For each calibration device 40, using a retaining device, such as a vacuum suction holder or the like, a displacement state at this time is kept constant, as is described below. Subsequently column 30 is moved downward.

An exposure surface of wafer W and the mask M are, if wafer W is placed on carrier 10, not always arranged parallel to one another. However, the mask and the wafer can be arranged parallel to one another and at the same time with a certain distance by means of the process for adjusting distance described above.

In the embodiment described above, a process in which wafer W is provided with a moving device 31 and is moved up and down relative to mask M, as well as a device for executing the process, are described. However, mask M can also move up and down relative to wafer W by providing mask carrier M10 with a moving device. In this case calibration devices 40 can, likewise, be arranged on the side of mask M. This means that it is sufficient if relative motion of mask M and wafer W is possible, so that they come into contact with one another.

Figure 2:
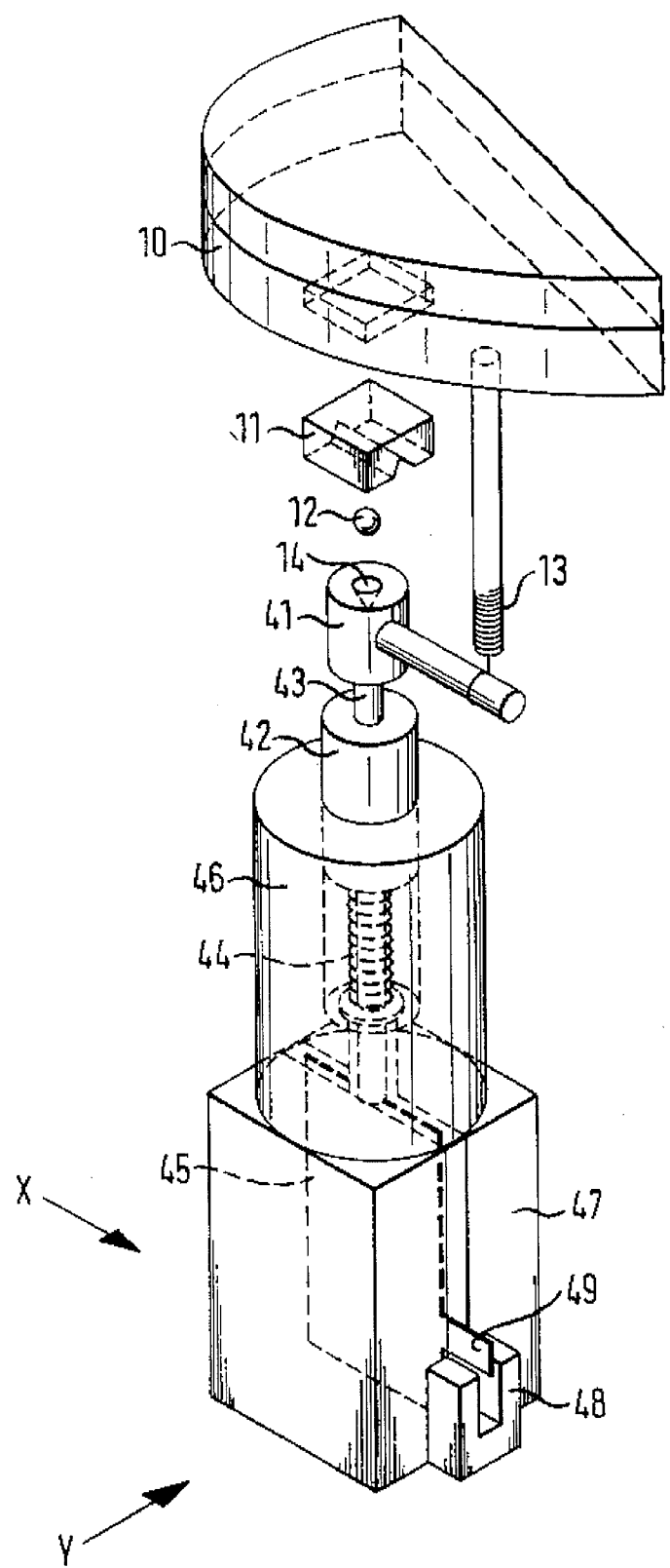
FIG. 2 is of a perspective exploded view of a calibration device of the FIG. 1 embodiment.

Fig. 2 shows, in schematic form, an arrangement of calibration device 40. Below the arrangement and operation of calibration device 40 is described using FIG. 2.

The V-shaped bearing 11 is installed on a lower side of carrier 10 and is connected to ball bearing 41 via steel sphere 12. Ball bearing 41 has a conical concave part 14 in the center which corresponds in contour to the surface of steel sphere 12. The steel sphere is located between an end of shaft 43 and mask carrier M10.

This arrangement is characterized in that carrier 10 can move freely only in the direction of the V-shaped groove of the V-shaped bearing 11 if carrier 10 is moved up and down.

Carrier 10 and ball bearing 41 are drawn towards one another by means of tension spring 13 which is a second elastic component. In the following, the reason for the arrangement of tension spring 13 is described:

A material used for exposure, such as a photoresist material, is applied to the wafer W. This photoresist material for mask M generates a minor adhesive force when wafer W and mask M come into contact with one another or move apart from one another. Carrier 10 does not immediately move, as a result of the adhesive force, when column 30 and base 20 begin to move by means of the moving device 31. The position of carrier 10 is held constant without being able to move down until, as the result of its gravitational force, the adhesion between the wafer W and the mask M is broken. When the adhesion is broken, without spring 13, the carrier 10 would fall onto steel sphere 12 and ball bearing 41, and as a result of an impact, the position of wafer W would shift. However, the arrangement of tension spring 13 can prevent this "falling" phenomenon, and thus, shifting of the position of wafer W.

Under ball bearing 41 is shaft 43 which extends through a spline 42, serving as a guide component, into a housing 46. Spline 42 controls motion of shaft 43 such that it moves only up and down. Shaft 43 is connected to a leaf spring 45, which is a plate-shaped, flexible body, after passing through housing 46.

Within housing 46, a flat coil compression spring 44 (which is a first elastic part and which exerts force on shaft 43) is in contact with a circumferential flange of shaft 43.

Leaf spring 45 is inserted into a suction block 47 as a retaining device and to some extent is provided with a convex part 49. To determine one position of convex part 49, a sensor 48 is provided as a determination device. Suction block 47 serves as a retaining device, and furthermore, has a vacuum drawing device (not shown), for example, a rotary vacuum pump connected thereto.

By means of the arrangement described above, flat coil compression spring 44, as a second elastic component, begins to contract in order to absorb a propulsive force when wafer W and mask M are in contact with one another and essentially further relative motion has become no longer possible.

By means of the contraction described above, leaf spring 45 is shifted and thus convex part 49 located on leaf spring 45 is also moved. Movement of convex part 49 is determined by sensor 48. Therefore, based on a positional relationship between convex part 49 and sensor 48 a stipulated amount of displacement can be set.

Attaining displacement of each calibration device 40 by a stipulated amount is communicated to the system controller. When all calibration devices 40 have executed a desired displacement, the moving device 31 is stopped, as described above. For each calibration device 40, the compression state of flat coil compression spring 44 is maintained at this time by operating the vacuum drawing device for suction block 47 as the retaining device which draws the leaf spring 45 against the suction ports in suction block 47 that are shown in FIGS. 3, 5, 7 and 9.

By moving wafer W away from mask M while the state described above remains preserved, a certain distance can be formed while maintaining a parallel positional relationship of wafer W to mask M.

The process of adjusting the distance between mask M and wafer W by means of calibration devices 40 is described below in concrete terms using FIGS. 3 through 10:

FIGS. 3, 5, 7 and 9 are schematic cross-sectional representations of calibration device 40 in the direction of the arrow X in FIG. 2.

Figure 9:
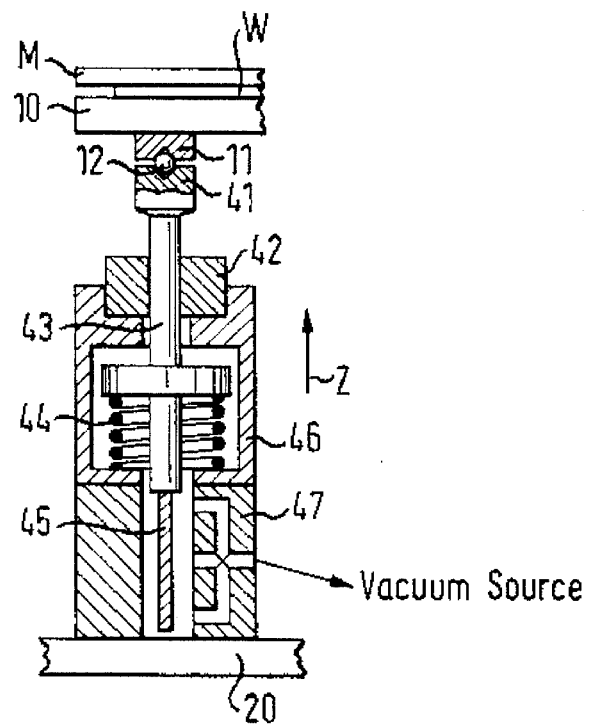
FIG. 9 is a schematic representation similar to that of FIG. 7 but depicting movement of the base beyond the point shown in FIG. 7.
Figure 10:
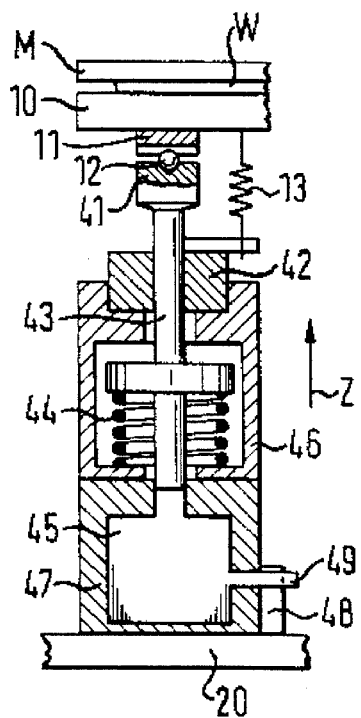
FIG. 10 is a schematic representation view similar to that of FIG. 8 but depicting movement of the base beyond the point shown in FIG. 8.
Figure 11:
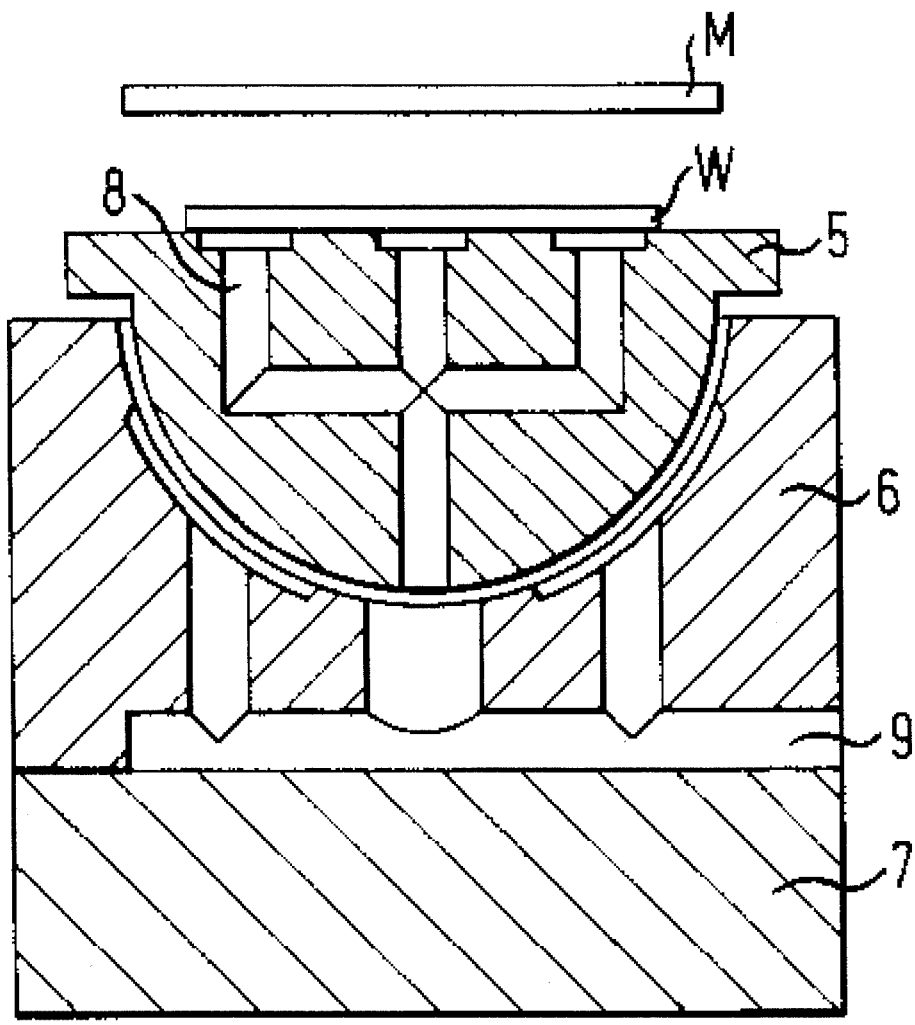
FIG. 11 shows a schematic representation of a conventional positioning process.
Figure 12:
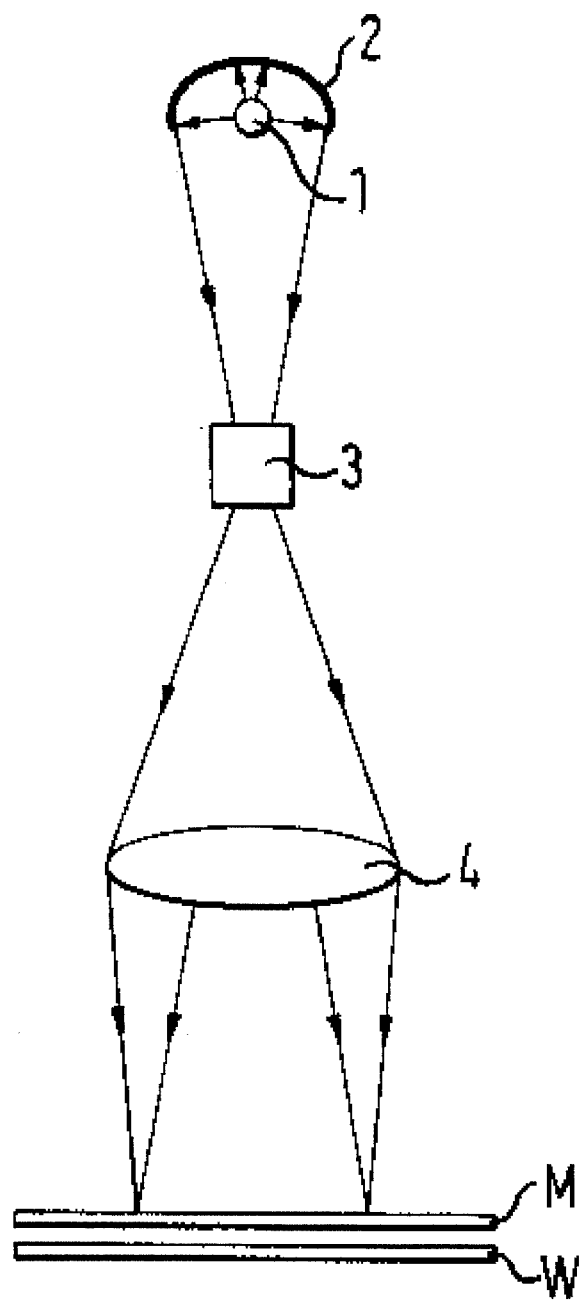
FIG. 12 shows a schematic representation of a known proximity exposure device.

FIGS. 4, 6, 8 and 10 are schematic cross-sectional views of calibration device 40 in the direction of arrow Y in FIG. 2. Each pair of figures, FIGS. 3 and 4, FIGS. 5 and 6, FIGS. 7 and 8 as well as FIGS. 9 and 10, show the same state and this sequence of figure pairs follows the follows the sequence of changes in state that occur in use.

Figure 3:
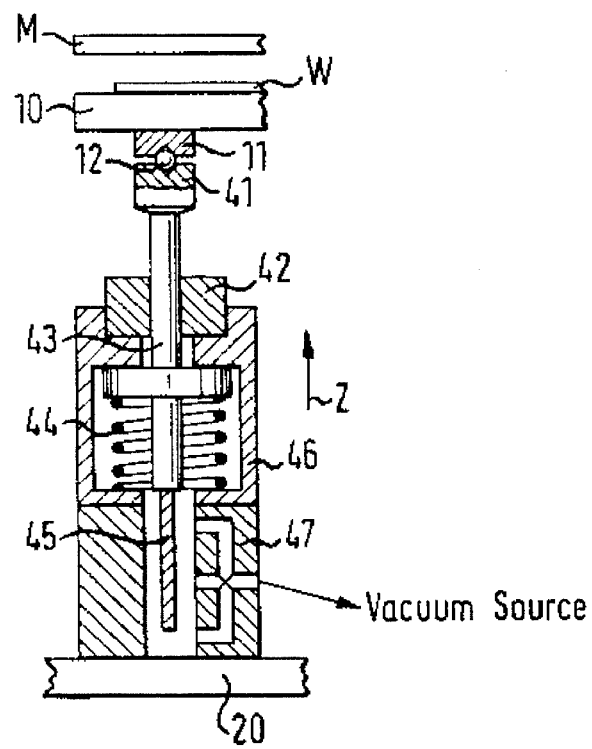
FIG. 3 is a schematic representation viewed from the direction of the X arrow in FIG. 2 prior to a wafer being brought into contact with a mask.
Figure 4:
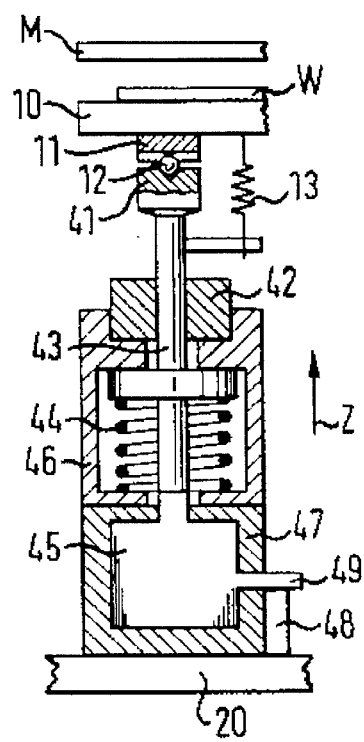
FIG. 4 is a schematic representation viewed from the direction of the Y arrow in FIG. 2 prior to a wafer being brought into contact with a mask.

FIGS. 3 and 4 show an initial state after the wafer W has been placed on carrier 10. In this case, the wafer W and mask M are not yet arranged parallel to one another.

If base 20, proceeding from the state described above, moves in the direction of arrow Z, calibration devices 40 likewise move. The distance between mask M and wafer W becomes shorter and shorter. In this state flat coil compression spring 44 remains inactive within housing 46, still being held by suction block 47.

Figure 5:
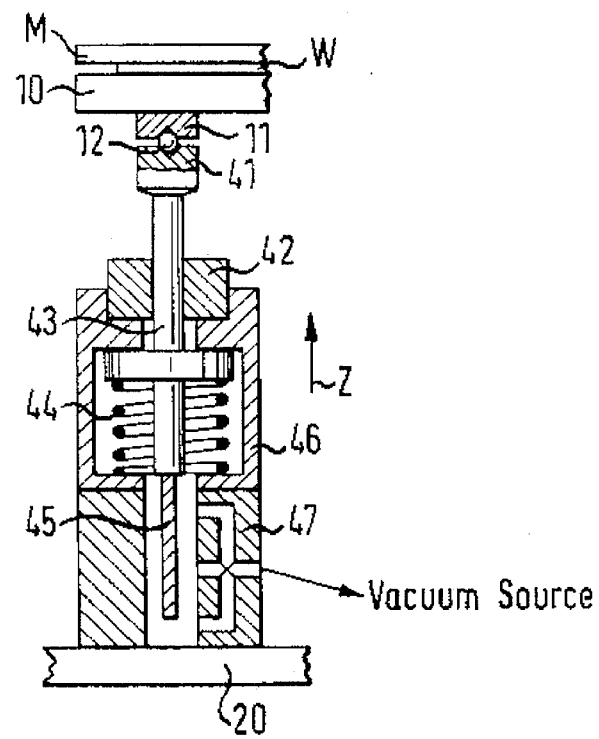
FIG. 5 is a schematic representation viewed from the direction of the X arrow in FIG. 2 after a wafer has been brought into contact with a mask;.
Figure 6:
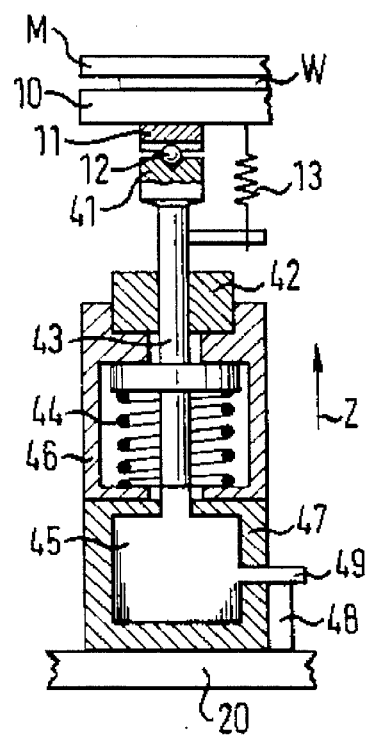
FIG. 6 is a schematic representation viewed from the direction of the X arrow in FIG. 2 after a wafer has been brought into contact with a mask.

FIGS. 5 and 6 illustrate a state in which mask M and wafer W have come into contact with one another, this means, in which movement of wafer W in the direction of arrow Z was continued, and wafer W has made contact with the mask M. Wafer W here only partially contacts the mask M, while other parts of the wafer W have not yet made contact with the mask M, since it is lifted in a state in which the wafer W is not parallel to mask M.

When the state described above is reached, flat coil compression spring 44 begins to contract, the entire surface of wafer W being brought completely into contact with the mask M. The at least three calibration devices 40 located on base 2 therefore do not always have the same amount of pressure applied by flat coil compression spring 44.

Figure 7:
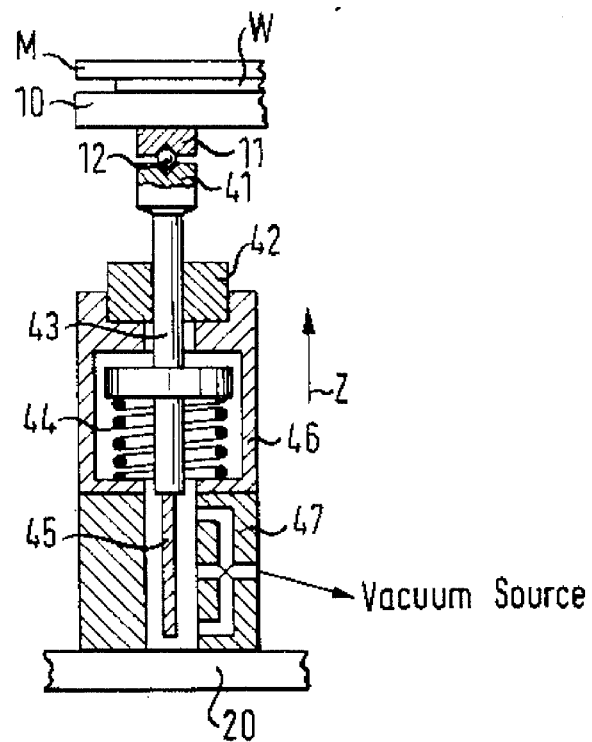
FIG. 7 is a schematic representation similar to that of FIG. 5 but depicting movement of the base beyond the point shown in FIG. 5.
Figure 8:
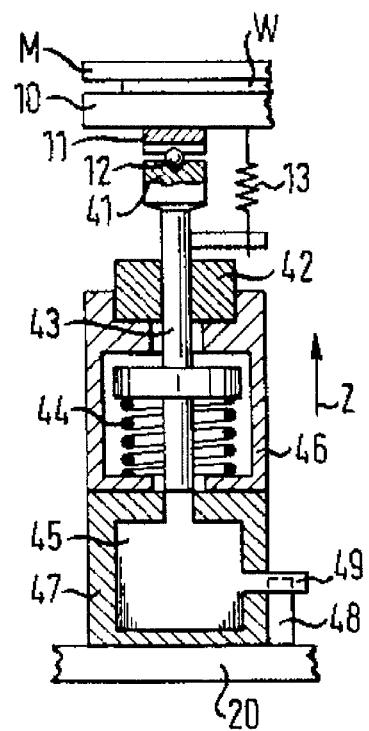
FIG. 8 is a schematic representation similar to that of FIG. 6 but depicting movement of the base beyond the point shown in FIG. 6.

FIGS. 7 and 8 show a state in which, after reaching a state in which mask M and wafer W have come into contact with one another and further motion has been completely precluded, movement of base 20 in the Z direction is continued and flat coil compression spring 44 is compressed in an amount corresponding to the motion. In this state the compression force of flat coil compression spring 44 is exerted via the shaft 43, ball bearing 41, steel sphere 12 and V-shaped bearing 11 on the carrier 10 in the direction of arrow z.

FIGS. 9 and 10 show a state in which movement in the direction of arrow Z has continued even further, flat coil compression spring 44 having been compressed and convex part 49 of leaf spring 45 having been detected by sensor 48. Sensor 48 is a photosensor comprised of a light outlet and a light receiver, and detects the interruption of light by the convex part 49 and issues signals responsive thereto. The stipulated compression force or the resulting displacement described above can be produced based on the positional relationship between sensor 48 and convex part 49.

The signals from sensors 48 in the at least three calibration devices 40 located on base 20 are each transmitted to the system controller. After the system controller has received the signals from all sensors 48, the moving device is stopped. Furthermore, during processing of all signals all leaf springs 45 are held against the respective suction block 47 by the vacuum effect noted above.

Proceeding from the state described above, the moving device is then driven in order to move wafer W down and away from mask M in steps. The moving device is stopped when a desired distance between mask M and wafer W is reached.

To determine the displacement of calibration devices 40 by a set amount, however, not only the process based on a compressive force of a flat coil compression spring, but also other processes can be carried out.

Carrier 10 furthermore have a suitable opening in the middle, such that it can hold the wafer W. In this case, exposure of both sides of the wafer can be achieved; this is impossible in the conventional process for adjusting distance using the spherical seat system.

EFFECT OF THE INVENTION

The device for adjusting the distance between a mask and a workpiece according to the invention allows production with lower costs than in production with a spherical seat system because, according to the invention, a spherical arrangement which requires high surface precision not needed.

It is to be understood that although a preferred embodiment of the invention has been described, various other embodiments and variations may occur to those skilled in the art. Any such other embodiments and variations which fall within the scope and spirit of the present invention are intended to be covered by the following claims.

We claim:

1. A process for adjusting distance for purposes of parallel positioning of a wafer spaced at a set distance relative to a mask, comprising the steps of:

a) holding a workpiece on a work-holding fixture spaced at a distance from a mask;

b) operating a moving device for moving one of the work-holding fixture and a mask carrier on which the mask is disposed in a first direction to bring the workpiece into contact with the mask;

c) continuing the operation of the moving device after the workpiece comes into contact with the mask;

d) transmitting a signal to a system controller from each of at least three means for alignment which are arranged on said one of the work-holding fixture and the mask carrier and which essentially begin to move and accept a propulsive force from the moving device beginning at a time at which the workpiece and mask come into contact with one another and essentially can no longer execute any further relative motion therebetween, when a determined amount of displacement of calibration devices of the alignment means has occurred;

e) discontinuing the operation of the moving device, stopping the movement of said one of the work-holding fixture and the mask carrier, when the system controller has received said signal from each of said means for alignment, and maintaining constant a parallel alignment of the workpiece and mask relative to one another determined on the basis of the signals in each of the means for alignment by fixing of the calibration device thereof;

f) moving said one of the work-holding fixture and the mask carrier by the set distance in a second direction, opposite to said first direction, to position the wafer at the set distance relative to the mask.

2. A device for adjusting the distance between a workpiece and a mask comprising a work-holding fixture for holding a workpiece, a mask carrier for holding a mask, a moving device for moving one of the work-holding fixture and the mask carrier toward and away from the other for moving the workpiece and the mask closer to one another and further from one another, and at least three means for aligning connected between said one of the work-holding fixture and the mask carrier and the moving device;

wherein the means for aligning contain calibration devices which are arranged to be displaced and to accept a propulsive force from the moving device upon engagement of the workpiece with the mask by continued operation of the moving device in a first direction corresponding to movement of the workpiece toward the mask after relative motion between the workpiece and the mask is essentially no longer possible; and wherein each calibration device has a determination device for determining when a predetermined displacement of the calibration device has occurred and a retaining device for holding the calibration device at said predetermined displacement.

3. A device for adjusting the distance between a workpiece and a mask according to claim 2, wherein the calibration devices have a housing, a shaft located in the housing, a guide component for preventing rotational movement of the shaft while permitting up and down movement thereof, a first elastic component which is installed within the housing and which exerts force on the shaft, a blade-type body, a retaining device for holding the shaft in a predetermined position over the first elastic component, a determination device for determining the amount of displacement of the first elastic component, a sphere located between one end of shaft and one of the work-holding fixture and the mask carrier, and a second elastic component for mutually drawing together the shaft and the mask carrier with a predetermined force.

\* \* \* \* \*